United States Patent
Ma et al.

(10) Patent No.: US 9,512,517 B2
(45) Date of Patent: *Dec. 6, 2016

(54) MULTIPLE EXPOSURE TREATMENT FOR PROCESSING A PATTERNING FEATURE

(71) Applicant: Varian Semiconductor Equipment Associates, Inc., Gloucester, MA (US)

(72) Inventors: Tristan Y. Ma, Lexington, MA (US); Maureen K. Petterson, Salem, MA (US); John Hautala, Beverly, MA (US); Ludovic Godet, Sunnyvale, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/645,646

(22) Filed: Mar. 12, 2015

(65) Prior Publication Data

US 2016/0215385 A1 Jul. 28, 2016

Related U.S. Application Data

(60) Provisional application No. 62/106,874, filed on Jan. 23, 2015.

(51) Int. Cl.
| | |
|---|---|
| *C23C 14/48* | (2006.01) |
| *H01L 21/027* | (2006.01) |
| *H01L 21/3105* | (2006.01) |
| *G03F 7/36* | (2006.01) |
| *C23C 14/04* | (2006.01) |

(52) U.S. Cl.
CPC .............. *C23C 14/48* (2013.01); *C23C 14/042* (2013.01); *G03F 7/36* (2013.01); *H01L 21/0276* (2013.01); *H01L 21/0277* (2013.01); *H01L 21/0279* (2013.01); *H01L 21/31058* (2013.01)

(58) Field of Classification Search
CPC .......... C23C 14/48; C23C 14/042; G03F 7/36; H01L 21/0276; H01L 21/0277; H01L 21/0279; H01L 21/31058
See application file for complete search history.

(56) References Cited

U.S. PATENT DOCUMENTS

| | | | |
|---|---|---|---|
| 6,352,936 B1 | 3/2002 | Jehoul et al. | |
| 9,268,228 B2* | 2/2016 | Godet | ...................... G03F 7/091 |
| 2009/0281016 A1 | 11/2009 | Cooper et al. | |
| 2014/0054679 A1* | 2/2014 | Tang | ..................... H01L 29/785 257/329 |
| 2014/0106522 A1 | 4/2014 | Tsai et al. | |

(Continued)

FOREIGN PATENT DOCUMENTS

JP          2013541845 A    11/2013

OTHER PUBLICATIONS

ISR and Written Opinion mailed May 11, 2016 in corresponding international patent application No. PCT/US2015/068047.

*Primary Examiner* — Duy Deo

(57) ABSTRACT

A method for processing a substrate may include providing a patterning feature on the substrate, the patterning feature having a sidewall. The method may further include implanting a first ion species into the patterning feature during a first exposure, the first ion species having a first implantation depth; and implanting a second ion species into the patterning feature during a second exposure, the second ion species having a second implantation depth less than the first implantation depth.

20 Claims, 4 Drawing Sheets

(56) References Cited

U.S. PATENT DOCUMENTS

2014/0242523 A1* 8/2014 Godet ............... G03F 7/091
  430/323
2014/0272728 A1 9/2014 Sinclair et al.

* cited by examiner

MULTIPLE EXPOSURE TREATMENT FOR PROCESSING A PATTERNING FEATURE

CROSS REFERENCE TO RELATED APPLICATIONS

This application claims priority to U.S. provisional patent application No. 62/106,874, filed Jan. 23, 2015, entitled "Multiple exposure treatment for processing a patterning feature," and incorporated by reference herein in its entirety.

FIELD

The present embodiments relate to substrate patterning, and more particularly, to techniques for treating patterning features with ions.

BACKGROUND

As semiconductor devices scale to smaller dimensions, a need has arisen to more accurately define and control the dimensions and shapes of photoresist (resist) features used to pattern substrates. Various techniques have been developed to treat photoresist features after the photoresist features are formed before the photoresist features are used to pattern a substrate. The treatment may be used, for example to control the shape and roughness for photoresist features.

Further improving processing of photoresist features or other patterning features may be useful in order to improve uniformity, mechanical stability, shape, etch resistance, or other features. Accordingly, with respect to these and other considerations the present improvements may be needed.

BRIEF SUMMARY

In one embodiment, a method for processing a substrate includes providing a patterning feature on the substrate, the patterning feature having a sidewall; implanting a first ion species into the patterning feature during a first exposure, the first ion species having a first implantation depth; and implanting a second ion species into the patterning feature during a second exposure, the second ion species having a second implantation depth less than the first implantation depth.

In another embodiment, a method for processing a patterning feature having a sidewall includes: providing a first species in a first exposure, the first species configured to penetrate the patterning feature to a first depth, and further configured to soften the patterning feature; and implanting a second species into the patterning feature during a second exposure, the second species comprising ions having a shallow implantation depth less than the first depth, wherein the second species is configured to generate a dense layer in an outer portion of the patterning feature having a first density larger than a second density in an inner portion of the patterning feature.

In a further embodiment, a method for patterning a substrate include providing a photoresist feature on the substrate; implanting a first ion species into the photoresist feature, the first ion species having a first ion energy configured to generate a first implantation depth; and after the implanting the first ion species, implanting a second ion species into the photoresist feature during a second exposure, the second ion species having a second implantation depth less than the first implantation depth, wherein, after the implanting the first ion species and second ion species, the photoresist feature comprises a shell and inner portion, the shell being denser and more cross-linked than the inner portion.

DETAILED DESCRIPTION

Figure 1A:
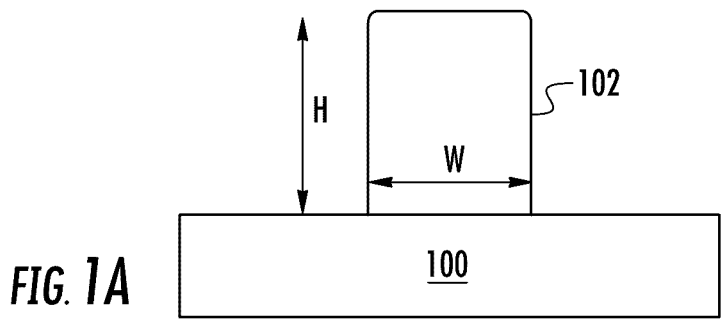
FIGS. 1A-1D depict a cross-sectional view of a photoresist feature at various instances illustrating exemplary operations involved in a method for processing a photoresist feature according to various embodiments of the disclosure.

The embodiments described herein provide techniques for processing a patterning feature such as a photoresist feature using multiple exposures of energetic species including ions, electrons, and vacuum UV radiation. The term "patterning feature" as used herein, refers to features such as photoresist, patterned underlayers including anti-reflective coatings (ARC), bottom anti-reflective coatings (BARC), or other features used to transfer a pattern into a substrate. Various embodiments provide various advantages over known techniques used to process photoresist. When ion implantation is used to treat a photoresist feature, improvements in line edge roughness (LER) or line width roughness (LWR) have been observed, for example, LER and LWR refers to variation along an edge of a photoresist line or in line width of a photoresist feature, for example, along a length of the photoresist feature as viewed in a plan view. As a drawback, implantation of ions may tend to degrade a photoresist profile, such as a cross-sectional profile of a photoresist feature. This may result in degraded etch performance when the photoresist feature is subsequently used as an etch mask, and may limit the improvement in LER or LWR (referred to herein collectively as "LER/LWR").

The present embodiments provide advantages including the ability to tailor the photoresist profile by directing multiple exposures to a photoresist feature, where an exposure may constitute implantation of ions or exposure to high energy electromagnetic radiation, for example. The multiple exposures may result in improved photoresist profiles (end cross-sectional) and may additionally improve line edge roughness. By providing multiple exposures the LER/LWR in a photoresist feature may be improved by over 30%, including improving LER/LWR in the low frequency range, where "low frequency range" refers to relatively longer scale variations along a photoresist line. The present embodiments may also provide improved etch selectivity with respect to an underlying layer disposed under a photoresist feature, as well as improved photoresist profiles with respect to known post-lithography treatment of photoresist.

The present embodiments may be especially advantageous for treating photoresist features having a "critical dimension" (CD) of 100 nm or less, where "CD" refers to a minimum feature size. In such photoresist features, LWR and LER may cause large and undesirable variations in CD within features within a substrate after etching of the substrate when the photoresist feature is in place. As noted, while known ion implantation may improve LER/LWR, the penetrated photoresist end cross-sectional profiles may be degraded, generating an undesirable profile to the photoresist feature. This may result in less than ideal etch behavior, as further discussed below.

In various embodiments, a multiple exposure process may be employed where a photoresist feature is processed by a first species penetrating the photoresist feature to a first depth in a first exposure, and is processed by a second species implanted to an implantation depth less than the first depth. In various embodiments, the first species may be provided as first ions implanting to a first implantation depth, or deep implantation depth, and the second species may be provided as second ions implanting to a second implantation depth, or shallow implantation depth, less than the first implantation depth. As used herein, the term "implantation depth" may refer to a depth with respect to a surface of a feature such as a photoresist feature, at which a peak in concentration of implanted species occurs. Advantageously, in embodiments where the first species comprise first ions, the first ions may be implanted where a first implantation depth represents a large fraction of the height of the photoresist feature, such as greater than 75% to 100%. The embodiments are not limited in this context. The term "implantation depth," as used herein, may refer to the range Rp of ions within the photoresist, as known in the art.

In other embodiments, the first implantation depth may extend to a depth greater than the height of the photoresist feature, so at least a portion of first ions are implanted into an underlayer disposed adjacent the photoresist feature for improved etch performance. In the second exposure, second ions may be provided at a second implantation depth less than the height of the photoresist feature, such as less than 50% of the height of the photoresist feature. The embodiments are not limited in this context.

In particular embodiments, first ions directed to a photoresist feature may be selected from low-mass ions such as hydrogen ions, helium ions, carbon ions, boron ions, or nitrogen ions. The embodiments are not limited in this context. The ion energy and ion dose of the first ions may be selected to modify the whole or a portion of the photoresist feature. This modification may include generating chain scission within the photoresist feature, generating cross-linking in the photoresist feature, removing hydrogen atoms from the photoresist feature, altering the density of the photoresist feature, or other chemical and/or physical effects.

In particular embodiments, the second ions provided in a second exposure may have a higher mass than the first ions. Exemplary second ions include inert gas ions, such as argon; silicon ions, or silicon-containing ions; and carbon. Other examples of second ions include krypton ions, xenon, ions, or germanium ions. The embodiments are not limited in this context. For example, in one embodiment carbon may be used as first ions implanted at an energy of 20 keV, while carbon is also used as second ions implanted at 1 keV.

In other embodiments the first species of a first exposure may constitute vacuum ultraviolet (VUV) radiation where the VUV radiation wavelength is less than 200 nm. The VUV radiation may be configured to penetrate to a depth representing a large fraction of the height of the photoresist feature, such as 75%-100%. For example in 193 nm photoresist, VUV photons may penetrate approximately 100 nm into a photoresist feature. Accordingly, VUV photons may entirely penetrate a photoresist feature having a height of 50 nm. The embodiments are not limited in this context. The exposure to VUV photons may generate similar effects in an exposed photoresist feature as the effects generated by the exposure to ions.

In other embodiments the first species of a first exposure may constitute electrons generated, for example, by a plasma also used as source for ion implantation. The electron radiation may be configured to penetrate to a depth representing a large fraction of the height of the photoresist feature, such as 75%-100%, to a similar effect as the VUV. The electrons may also be configured to penetrate just a small fraction of the height of the photoresist feature, such as 10-30%, to complement the more deeply penetrated species, such as low-mass ions.

In various embodiments, the first exposure may be a combination of any of the aforementioned species including ions, VUV, and electrons.

Advantageously, according to various embodiments of the disclosure, the first exposure where first species penetrate the photoresist layer to a first depth may be provided before a second exposure where ions are implanted to an implantation depth less than the first depth. The first exposure may homogenize the photoresist feature and other underlying layer(s), eliminating or reducing a chemical and mechanical gradient otherwise having an unwanted effect on the resist profile and etching properties. The first exposure may also minimize differences in mechanical properties in different portions of a photoresist feature, by generating a density gradient between the bulk, or interior portion, and the shell, or outer portion, of the photoresist feature. The ion implantation in a second exposure may be performed at an implantation depth relatively shallow compared to the first depth. Accordingly, the second exposure may induce the formation of a highly densified shell surrounding the inner portion of the photoresist feature. By providing a first exposure before the second exposure and thus reducing differences in mechanical properties between outer portion and inner portion of the photoresist, the surface tension may be reduced, as well as unwanted deformation of the photoresist feature otherwise caused by the surface tension.

In addition, the first exposure may facilitate polymer reorganization and reflow of the photoresist feature, reducing LER/LWR.

In various additional embodiments, as discussed below, the first exposure and second exposure may be performed simultaneously.

Turning now to FIGS. 1A-1D there is shown a cross-sectional view of a photoresist feature at various instances illustrating exemplary operations involved in a method for processing a photoresist feature according to various embodiments of the disclosure. FIG. 1E and FIG. 1F depict a top plan view of the photoresist feature at the instances depicted in FIGS. 1A and 1D, respectively.

In FIG. 1A a photoresist feature 102 is disposed upon a substrate 100. In various embodiments the substrate 100 may include multiple layers (not shown) including an interlayer such as an antireflection coating (ARC), spin on carbon (SOC) layer, or other layer. The photoresist feature 102 may be characterized by a height H along the Z-direction of the Cartesian coordinate system shown, as well as a width W along the Y-direction, and length L along the X-direction (see FIG. 1E). The photoresist feature 102 may also be characterized by an LER or an LWR where the value is measured by variations in the width W at different points along the length L of the photoresist feature 102 as suggested by FIG. 1E. In some embodiments, the width W may correspond to the CD and may be 100 nm or less. In various embodiments, the photoresist feature 102 may form part of a pattern of features disposed on a silicon wafer or other substrate having dimensions in the X-Y plane on the order of hundreds of millimeters. Accordingly, the photoresist feature 102 may be characteristic of many other similar features disposed on the substrate 100, such as millions or billions of other similar features. In order to transfer a target shape and size of a feature to the substrate 100 by etching the substrate 100, improving the LWR of photoresist feature 102 may be useful while maintaining an acceptable sidewall profile before etching.

Figure 1B:
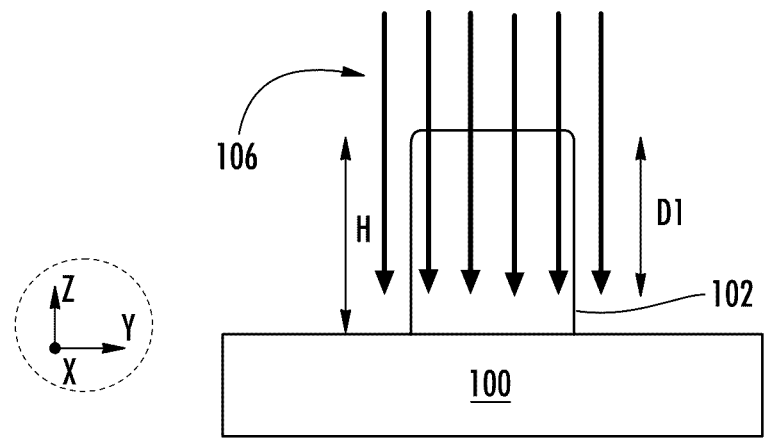

FIG. 1B illustrates a first exposure according to a method of the present embodiments, where first species 106 are directed to the photoresist feature 102. The first species 106 may constitute ions in some embodiments or VUV radiation or electrons in other embodiments. The first species 106 may penetrate into the photoresist feature 102 to a depth D1 as illustrated. In the example of FIG. 1B the depth D1 is shown as being less than the height H. Alternatively, in other embodiments, the depth D1 may exceed the height H or may be the same as height H. The first exposure shown in FIG. 1B may be performed in a manner altering the photoresist feature 102 as discussed above.

As noted above, the first exposure may generate chain scission within the photoresist feature 102, generate cross-linking in the photoresist feature 102, alter the density of the photoresist feature 102, or generate other effects. The first exposure may homogenize the photoresist feature 102, eliminating a chemical and mechanical gradient after subsequent processing otherwise affecting the resist profile and etching properties. The first exposure may also improve LER/LWR in the photoresist feature 102. In embodiments where first species 106 constitute ions and the depth D1 exceeds H, the ions may thus penetrate into an underlayer (not shown) such as an ARC layer. In particular embodiments such ions may have low mass such as 1 Dalton (Da) to 12 Da. The penetration into an underlayer may relieve residual stress and thus facilitate pattern etch transfer while avoiding the phenomenon of line wiggling.

In various embodiments where ions constitute the first species 106, the ions may be provided to the photoresist feature 102 in a beamline ion implanter, a plasma doping tool (PLAD), a plasma tool having a plasma sheath modifier as known in the art, or other tool capable of providing ions. The embodiments are not limited in this context. When provided as ions, the first species 106 may be directed as a beam of parallel ions along the Z-direction, in other words, along a perpendicular to an X-Y plane of the substrate 100. Alternatively, the first species 106 may also be directed along a direction forming a non-zero angle with respect to a perpendicular to the X-Y plane. In other embodiments, the first species 106 may be provided over a range of angles with respect to a perpendicular to the X-Y plane. Examples of suitable ions for use as the first species 106 include $H^+$, $H_2^+$, $H_3^+$, $He^+$, and carbon ions. The embodiments are not limited in this context.

Figure 1C:
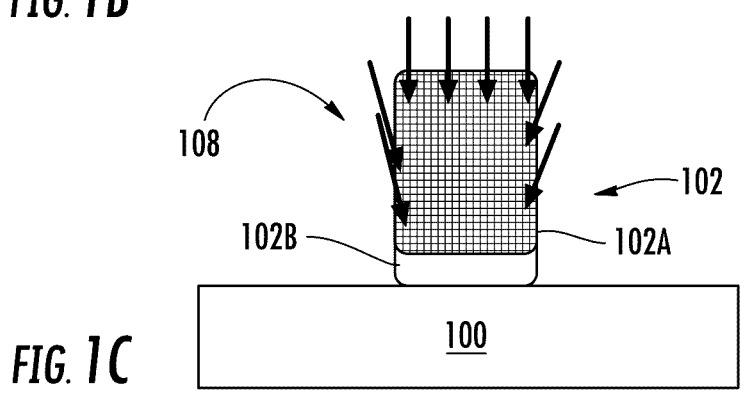

FIG. 1C illustrates a second exposure according to a method of the present embodiments, where second species are provided as ions 108 and are directed to the photoresist feature 102. In different embodiments, the second exposure may take place subsequently to the first exposure depicted in FIG. 1A or may take place simultaneously to the first exposure. In the specific scenario illustrated in FIG. 1C, the photoresist feature 102 is depicted as having an altered portion 102A, representing a portion of the photoresist feature 102 altered by the first exposure. The photoresist feature 102 may also exhibit an unaltered portion 102B representing an unaltered portion of the photoresist feature 102. The unaltered portion 102B may be present in circumstances where the first species 106 penetrate to a depth D1 less than H, as suggested in FIG. 1B. Alternatively, in other embodiments D1 may exceed or equal H so no unaltered portion 102B is present after the first exposure. The alteration in an altered portion 102A may include chemical alteration, such as changes in cross-linking, polymer chain scission, or changes in photoresist composition. The altered portion 102A may also be physically altered by changes in density and stress, for example. In some embodiments, such as when the first species 106 are provided as ions, the altered portion 102A may exhibit a gradient in properties due to a gradient in ion species, implant damage, and other features as a function of position, such as along the Z-direction.

During the second exposure shown in FIG. 1C, ions 108 are provided at an ion energy and ion dose resulting in an implantation depth D2 (see FIG. 1D) less than D1. In some examples H may range from 20 nm to 150 nm, W may range from 10 nm to 100 nm, and D2 may range from 3 nm to 25 nm. The embodiments are not limited in this context. Suitable species for ions 108 include, and are not limited to, inert gas ions, silicon ions, carbon ions, or silicon-containing ions. The ions 108 may be directed as a beam of parallel ions along the Z-direction, in other words, along a perpendicular to an X-Y plane of the substrate 100. Alternatively, the ions 108 may also be directed along a direction forming a non-zero angle with respect to a perpendicular to the X-Y plane. In other embodiments, the ions 108 may be provided over a range of angles with respect to a perpendicular to the X-Y plane.

Figure 1D:
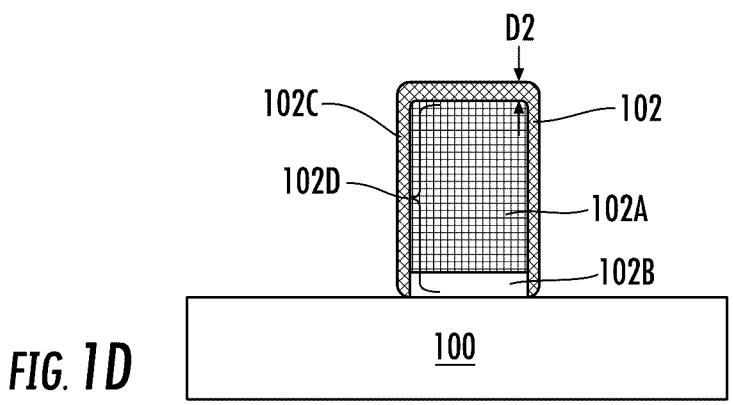
Figure 1E:
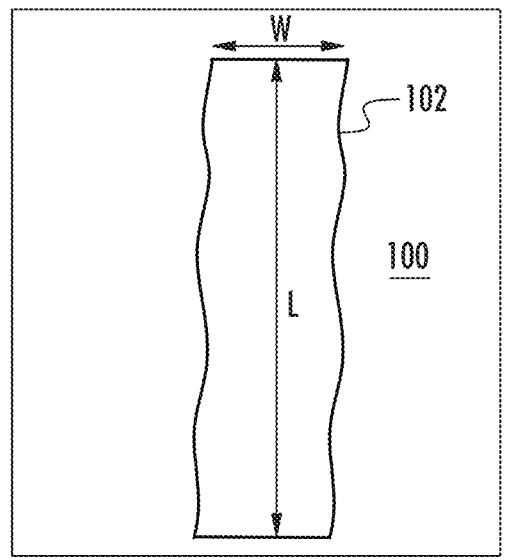
FIGS. 1E and 1F depict a top view of the photoresist feature at the instances depicted in FIGS. 1A and 1D, respectively.
Figure 1F:
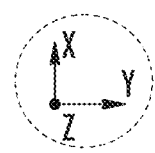
Figure 1F:
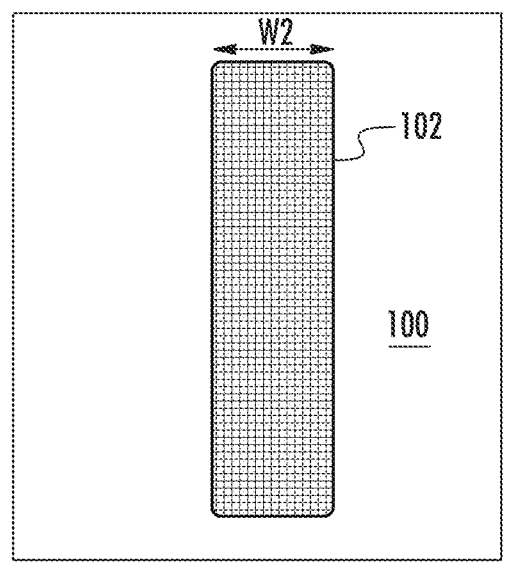

FIG. 1D illustrates a resultant structure of the photoresist feature 102 after completion of the second exposure generally illustrated at FIG. 1C. As shown, the photoresist feature 102 includes an outer portion 102C having a thickness, at least along the Z-direction corresponding to D2. The outer portion 102C surrounds an inner portion 102D, representing remaining parts of altered portion 102A and unaltered portion 102B.

A result of the second exposure may be to form a denser shell as exhibited by the outer portion 102C around the photoresist feature 102. The use of relatively heavier ions in the second exposure as compared to those used in the first exposure may cause more damage in a photoresist polymer, resulting in generation of a layer (shown in FIG. 1D as outer portion 102C) forming as a shell and is denser and more cross-linked than the bulk, or inner portion 102D of the photoresist feature 102. The higher density and increased cross-linking may produce tensile stress within this shell. In accordance with some embodiments, the ion dose and ion energy and ion species may be tuned to control the tensile stress in the outer portion 102C to act as a driving force to further facilitate the photoresist reflow initially facilitated by the first exposure shown in FIG. 1B. This may result in producing smoother lines and lower LER/LWR in photoresist feature 102, as suggested in FIG. 1F.

For simplicity of illustration, in this example, the outer portion 102C on the top of the photoresist feature 102 is represented as having a thickness the same as implantation depth D2. In the present embodiments, the actual thickness of a highly altered shell may in general differ at least slightly from the implantation depth of ions used to create the shell. In addition, the thickness of the outer portion 102C may be different along sidewalls than along a top of the photoresist feature 102. This may be controlled, for example, by the initial profile of the photoresist feature as well as the angle(s) of incidence of the ions 108.

The second exposure generally depicted in FIG. 1C may also serve to freeze first patterns in a litho-freeze-litho-etch (LFLE) multi-patterning approach so the newly formed patterns can survive the subsequent lithography operations used to produce the second patterns. In addition, the second exposure may improve etch selectivity of the photoresist feature 102 with respect to an underlayer (not shown), such as a bottom anti-reflective coating (BARC) including an Si-ARC. In particular embodiments, the ions 108 constitute silicon ions, where the silicon ions may be especially useful for improving the etch resistance of photoresist feature 102. This improved etch resistance may be increasingly useful as the height H is decreased as photoresist features become smaller to generate smaller substrate features.

In exemplary embodiments of a multiple exposure method, a first exposure may comprise relatively lighter ions such as hydrogen or helium ions wherein an ion dose is provided over the range of $1E14/cm^2$ to $2E16/cm^2$ and more particularly in the range of $1E14/cm^2$ to $5E15/cm^2$ and at an ion energy of 1 keV-20 keV. A second exposure may comprise relatively heavier ions such as argon ions or silicon ions, wherein an ion dose is provided over a range of $1E15/cm^2$ to $3E16/cm^2$ and more particularly in the range of $5E15/cm^2$ to $3E16/cm^2$ and an ion energy of 0.5 keV-3 keV.

Figure 1G:
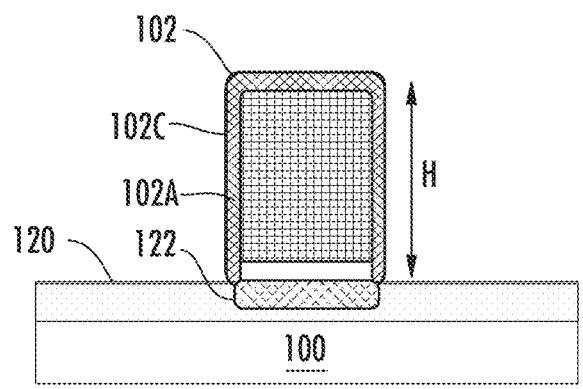
FIG. 1G depicts a cross-sectional view of a photoresist after processing according to another exemplary embodiment of the disclosure.

FIG. 1G depicts a cross-sectional view of a photoresist feature 102 after processing according to another exemplary embodiment of the disclosure. In this example, the photoresist feature 102 may be processed generally as described above with respect to FIGS. 1A-1F, save the depth D1 of first species being greater than H. This results in the formation of an altered portion 122 of an underlayer 120. In some embodiments, the underlayer 120 may be an ARC layer and the formation of the outer portion 102C may confer a higher etch selectivity of the photoresist feature 102 with respect to the underlayer 120.

Figure 2A:
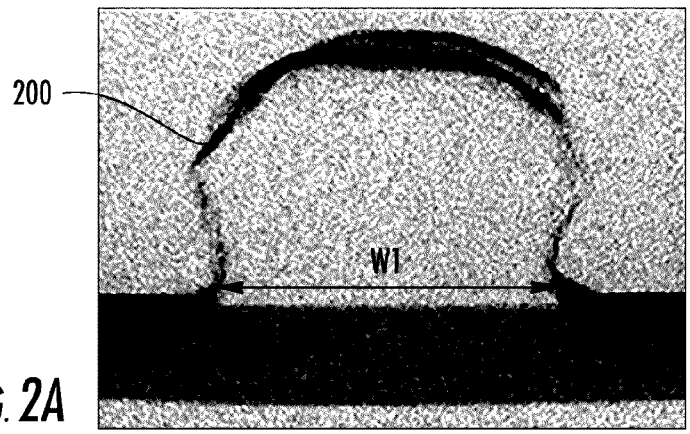
FIGS. 2A-2B depict cross-sectional micrographs of exemplary photoresist structures at two different instances according to a method for processing a photoresist feature according to additional embodiments of the disclosure.
Figure 2B:
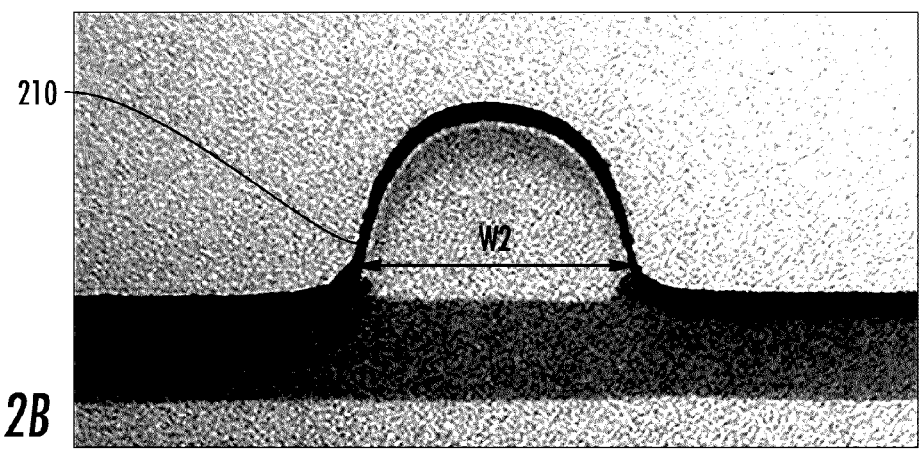
Figure 2C:
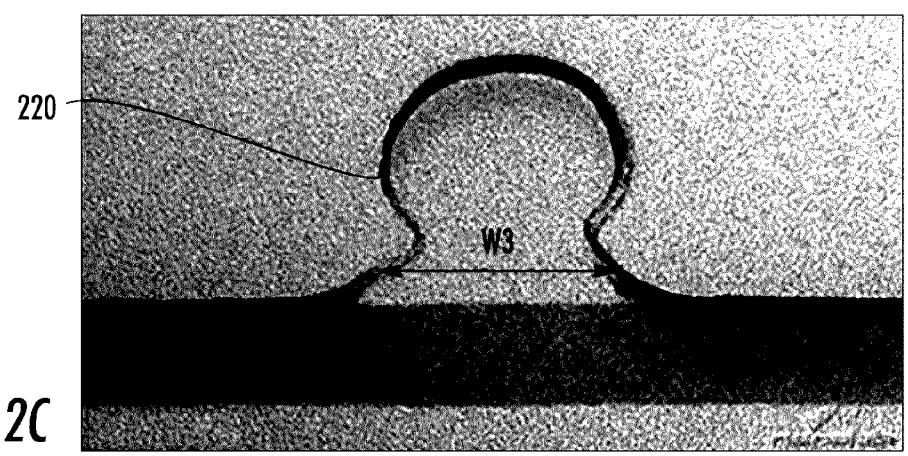
FIG. 2C depicts a cross-sectional micrograph of a photoresist structure at after processing using a lone implantation process.

In the figures to follow there are shown experimental examples of processing of photoresist features according to embodiments of the disclosure. FIGS. 2A-2B depict cross-sectional micrographs of exemplary photoresist structures at two different instances according to a method for processing a photoresist feature according to additional embodiments of the disclosure. FIG. 2C depicts a cross-sectional micrograph of a photoresist structure after processing using a lone implantation process. In FIG. 2A, the photoresist feature 220 has a width W1 approximately 70 nm. The profile of the resist feature is slightly re-entrant. In FIG. 2B there is shown a photoresist feature 210 representing processing of the photoresist feature 220 with multiple exposures in accordance with embodiments of the disclosure. In this example, the photoresist feature 210 was subject to a first exposure of $H^+$ ions in a beamline ion implanter, followed by a second exposure of Si ions. As evident, the linewidth or width W2 is less than W1. In addition, the profile of the photoresist feature 210 is smooth and convex. In FIG. 2C there is shown a photoresist feature 220 representing processing of the photoresist feature 220 with an exposure to silicon ions under the same treatment as in FIG. 2B, save the exposure to hydrogen ions being omitted. In this example, the profile of the photoresist feature 220 exhibits a reduced width, shown as width W3. In addition, the photoresist feature 220 exhibits a reentrant profile characterized by necking resulting in a "mushroom" shape, generating poor etch characteristics for the photoresist feature 220. Thus, the sidewall profile of the photoresist feature 210 may be deemed to be less reentrant than the sidewall profile of the photoresist feature 220, since the width of the photoresist feature 210 does not decrease from top portions of the photoresist feature 210 to the lower portions of the photoresist feature 210. As evident, the width of the photoresist feature 220 does decrease from top portions to lower portions of the photoresist feature 220.

In the example of FIG. 2C, the resulting profile of photoresist feature 220 may be caused by a significant difference in mechanical properties between a densified layer created by Si implantation in an outer portion of the photoresist feature 220, with respect to the bulk resist polymer within the inner portion of photoresist feature 220. This may result in tensile stress within the densified layer. The photoresist feature 220 may deform under the effect of this tensile stress to minimize surface energy, similar to the action of a water droplet under the effect of surface tension. This produces a problematic resist profile as shown in FIG. 2C. The "necking" formed close to the base of the photoresist feature may be a combined result of (i) formation of a photoresist "droplet" to minimize surface tension, and (ii) pinching of the photoresist feature 220 at the interface between the resist and an underlayer (Si-ARC in this case). Such a profile may negatively affect the subsequent etching performance due to varying CD, such as width W3. The instability resulting from the necking may also lead to line collapsing and wiggling during etching.

In further embodiments, the temporal relation between the first exposure and second exposure may vary. For example, a first exposure may implant ions throughout a resist feature and a second exposure may implant ions in an outer region of the resist feature as depicted above with respect to FIGS. 1A-1F. In some embodiments the first exposure may be performed before or during the second exposure. As detailed below, when the sequence of these two exposures is varied, the structure of the resulting photoresist features varies. In particular, if a "second" exposure where ions are implanted in an outer portion occurs before a "first" exposure where ions are implanted throughout the resist feature, problematic photoresist profiles are produced.

Figures 3A, 3B:
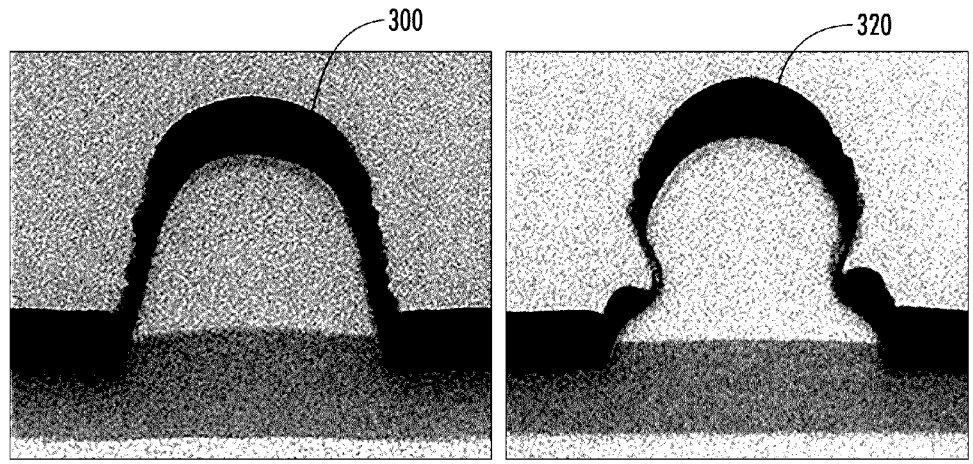
FIG. 3A depicts a cross-sectional micrograph of a photoresist structure at after processing according to further embodiments of the disclosure.
FIG. 3B depicts a cross-sectional micrograph of a photoresist structure at after processing when an order of implantation operations is altered.

FIG. 3A and FIG. 3B depict micrographs of photoresist features showing varying results when a photoresist feature is subject to process flows entailing identical process conditions for two separate exposures, save the order of exposures being reversed between process flows. In FIG. 3A there is shown a photoresist feature 300 subject to a first exposure of hydrogen ions from $H_2$ gas followed by a second exposure of Ar ions. In FIG. 3B there is shown a photoresist feature 320 having been subject to a first exposure of Ar ions followed by a second exposure of hydrogen ions from $H_2$ gas. As evident, the photoresist feature 300 exhibits a smooth profile, while the photoresist feature 320 exhibits a reentrant profile.

Other test data has confirmed when a global exposure in a plasma tool where a "first" exposure of relatively lighter ions is conducted simultaneously with a "second" exposure of relatively heavier ions, the same resist smoothing while avoiding necking is achieved, as shown in FIG. 3A. Such a global exposure may be considered to provide two different simultaneous exposures to different ions, and may be carried out, for example, by providing a plasma having different ion species, such as hydrogen and argon species. Notably, the ion energy of ions provided to a resist feature may be the same for hydrogen ions and argon ions. Accordingly, the exact ion energy as well as relative flux of hydrogen ion in comparison to argon ions may be controlled to generate a target photoresist structure, such as the structure exhibited in FIG. 1D or FIG. 1G.

In various embodiments, the dose of ions such as hydrogen ions provided in a first exposure may be controlled to avoid excessive sputtering and etching. This may be particularly useful when the first exposure is provided by a plasma tool where free radicals may also impinge upon a photoresist feature. The ion energy and other process parameters may also be carefully controlled in a plasma tool to optimize the type of species hydrogen species provided to a photoresist feature in a first exposure. For example, in plasma based tools, in addition to $H^+$ ions, dimers ($H_2^+$) and trimers ($H_3^+$) are often generated, producing a different ion profile within a photoresist feature in comparison to a pure $H^+$ implantation performed using a beamline ion implanter. In various embodiments, the selection of implant parameters such as gas flow rate and RF power may be chosen to alter the ratio of the different hydrogen ions. For example, reducing the concentration of $H_2^+$ and $H_3^+$ with respect to $H^+$ may be useful, since, owing to their increased mass, the dimers and trimers do not penetrate as deeply into a photoresist feature as $H^+$ for a given implant energy. Thus processing of a photoresist feature with $H_2^+$ and $H_3^+$ in a plasma tool may confer less benefit associated with deep implantation, and may accordingly be reduced by proper choice of process parameters in the plasma tool.

Moreover, the ion energy and ion dose provided in a first exposure and in a second exposure may be tailored to achieve a balance between producing a target resist profile and improved LER/LWR, and minimizing excessive sputtering of resist materials. Control of ion angles of ions may also be useful during a second exposure where a dense outer portion of a photoresist feature is formed. For example, providing at least a portion of ions at a non-zero angle of incidence with respect to the Z-direction may be useful (see FIGS. 1A-1D) in order to form a shell on sidewalls of a photoresist feature as well as top of the photoresist feature.

In addition, according to various embodiments a balance is provided between heavy ions and light ions directed in different exposures to a photoresist feature. Among considerations for selecting a recipe for multiple exposures, the ion dose for light ions may be optimized between a lower dose threshold adequate to cause acceptable homogenization and polymer reflow, and an upper dose threshold, where above the upper threshold excessive crosslinking occurs, hardening the photoresist. This hardening may render the reduction of LER difficult and may cause sidewall striation during subsequent etching. The ion dose, ion energy and choice of ions may also be selected to avoid excessive resist loss. The dose of relatively heavy ions, such as silicon or argon, may be chosen to be adequate to cause densification/freezing/hardening of a photoresist feature. Such heavy ions may be damaging to sensitive photoresist and therefore ion dose may be limited to reduce photoresist damage.

Moreover, sputtering and potential etching by free radicals may be integral part of an ion implantation process conducted in a plasma tool. As a consequence, reduction in CD (W) may be unavoidable after processing by a first exposure and second exposure. By balancing the process parameters of light and heavy ions, in accordance with various embodiments, reflow of a photoresist feature may be facilitated with relatively less sputtering and/or etching, thus minimizing CD loss. In fact, generating a controllable CD loss (CD trimming) may be useful after the first exposure and second exposure since CD trimming provides a mechanism to generate etched features within a substrate smaller than the photoresist features generated by photolithography alone.

In accordance with additional embodiments, substrate temperature of a substrate supporting a photoresist feature may be controlled during multiple exposures to improve resulting structure of the photoresist feature. In some embodiments the substrate temperature may range between 25° C. and 75° C. in order to facilitate reducing LER/LWR while avoiding excessive flow of a photoresist feature. In particular embodiments, a substrate temperature of 55° C. may be used.

While the above examples have focused on embodiments for processing photoresist features, in other embodiments multiple exposures may be performed to treat other patterning features, such as underlayers disposed underneath a photoresist feature. For example, in order to transfer a pattern to a substrate layer to remain within the substrate, such a silicon or polysilicon, multiple layers may be employed as patterning layers, including photoresist, ARC layers, carbon layers, hard masks, and so forth. A pattern initially defined by a photoresist feature may be transferred to an interlayer or layers disposed underneath the photoresist layer, including, for example, an ARC layer. In one instance, after patterning of a photoresist layer to form at least one photoresist feature, an underlying ARC layer is exposed in regions where the photoresist layer is removed. The ARC layer may subsequently be etched, transferring the pattern of the photoresist feature into the ARC layer, resulting in a patterned ARC feature or features.

In accordance with additional embodiments, after an ARC layer is patterned to generate an ARC feature, multiple exposures may be performed as generally described above, where a first exposure penetrates to a first depth through the ARC feature and a second exposure using implanting ions implants the ions to implant to a second depth shallower than the first depth. This may serve to improve the shape of an ARC feature in a manner similar to the manner described above with respect to a photoresist feature. For example, some ARC materials may have a polymer composition amenable decreasing roughness when subject to the multiple exposure treatments described above.

In some embodiments, multiple exposure treatment of an ARC feature may be performed while a photoresist feature is in place above the ARC feature. For example, a large portion of the photoresist feature may be removed during etching to form the ARC feature, so implanting ions, or electrons or VUV radiation easily penetrate into the ARC feature.

In additional embodiments a first multiple exposure treatment may be performed to treat a photoresist feature, and a second multiple exposure treatment may be performed to treat a feature of an underlayer, such as an ARC feature. Alternatively, in further embodiments, just the ARC feature may be treated by multiple exposures.

Figures 4, 5:
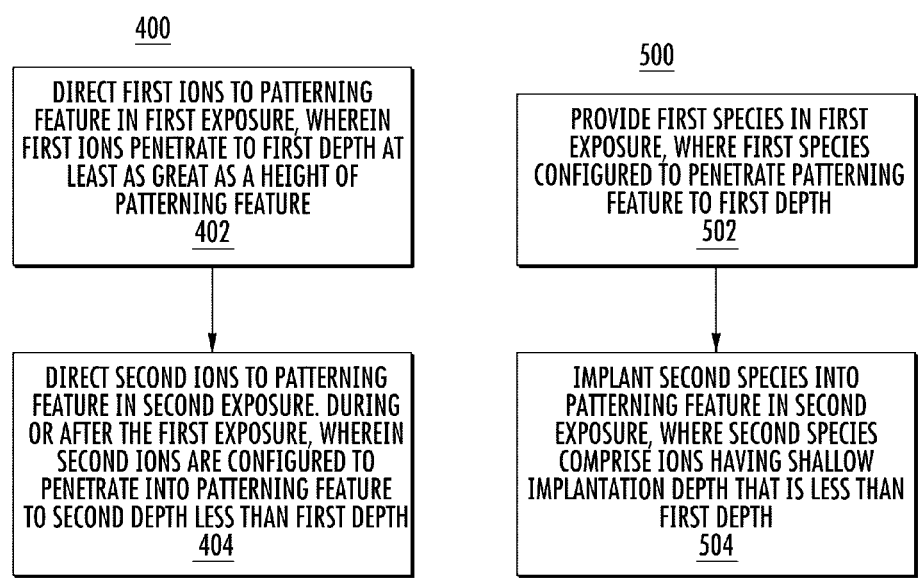
FIG. 4 depicts an exemplary process flow.
FIG. 5 depicts another exemplary process flow.

FIG. 4 depicts an exemplary process flow 400. At block 402 first ions are directed to a patterning feature in a first exposure. The first ions may be configured to penetrate to a first depth at least as great as a height of the patterning feature in some instances. The first species may comprise relatively light ions such as hydrogen, helium, or carbon in some instances. At block 404, second ions are directed to the patterning feature in a second exposure. In various embodiments, the second exposure comprises relatively heavier ions directed to the patterning feature during or after the first exposure. The ions of the second exposure may be configured to penetrate into the patterning feature to a second depth lesser than the first depth, and may generate an outer portion of the photoresist feature relatively denser than an inner portion of the patterning feature.

FIG. 5 depicts an exemplary process flow 500. At block 502 first species are provided in a first exposure, where the first species are configured to penetrate a patterning feature to a first depth, and further configured to soften the patterning feature. In various embodiments, the first species may comprise ions, vacuum ultraviolet radiation, or electrons. In some embodiments, the patterning feature may comprise a patterned photoresist feature, while in other embodiments, the patterning feature may comprise a patterned anti-reflective coating feature or other patterned feature. In some embodiments, the first depth may represent a position where the whole patterning feature is penetrated by the first species. At block 504, second species are implanted into the patterning feature during a second exposure, the second species comprising ions having a shallow implantation depth less than the first depth. The second species may be configured to generate a dense layer in an outer portion of the patterning feature having a first density larger than a second density in an inner portion of the patterning feature.

In sum, the present embodiments provide advantages including the ability to tailor the photoresist profile by directing multiple exposures to a photoresist feature, where the multiple exposures may result in improved cross sectional photoresist profiles and improved line edge roughness. The present embodiments may also provide improved etch selectivity with respect to an underlying layer disposed under a photoresist feature, as well as improved photoresist profiles with respect to known post-lithography treatment of photoresist.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for processing a substrate, comprising:
providing a patterning feature on the substrate, the patterning feature having a sidewall;
implanting a first ion species into the patterning feature during a first exposure, the first ion species having a first implantation depth; and
implanting a second ion species into the patterning feature during a second exposure, the second ion species having a second implantation depth less than the first implantation depth, wherein the patterning feature is a photoresist feature disposed adjacent an interlayer, wherein the first implantation depth is configured to place at least some of the first ion species within the interlayer.

2. The method of claim 1, wherein the patterning feature is a first patterning feature, and wherein the first patterning feature has a width that does not decrease from a top portion of the first patterning feature to a lower portion of the first patterning feature, and wherein a second patterning feature implanted by the second ion species using the second exposure and not implanted with the first ion species using the first exposure has a width that does decrease from a top portion of the second patterning feature to a lower portion of the first patterning feature.

3. The method of claim 2, wherein the first patterning feature and second patterning feature have a same resist height along a first direction and a same width along a second direction perpendicular to the first direction.

4. The method of claim 1, wherein the first exposure is performed before the second exposure.

5. The method of claim 1, wherein the first exposure is performed simultaneously with the second exposure.

6. The method of claim 1, wherein the second ion species comprises a mass greater than 3 Dalton.

7. The method of claim 1, wherein the second ion species is configured to generate a dense layer in an outer portion of the patterning feature having a first density larger than a second density in an inner portion of the patterning feature.

8. The method of claim 1, wherein the first ion species comprises hydrogen ions, helium ions, carbon ions, boron ions, or nitrogen ions.

9. The method of claim 8, wherein the second ion species comprise argon ions, silicon ions, krypton ions, xenon ions, or germanium ions.

10. The method of claim 8, wherein the first exposure comprises an ion dose of $1E14/cm^2$ to $2E16/cm^2$ and an ion energy of 1 keV-20 keV.

11. The method of claim 10, wherein the second exposure comprises an ion dose of $1E15/cm^2$ to $3E16/cm^2$ and an ion energy of 0.5 keV-3 keV.

12. The method of claim 1, wherein a substrate temperature during the first exposure and second exposure is between 25° C. and 75° C.

13. The method of claim 1, wherein the first ion species and second ion species comprise a same ion species, wherein the first exposure comprises a first ion energy, and the second exposure comprises a second ion energy less than the first ion energy.

14. A method for patterning a substrate,
providing a photoresist feature on the substrate;
implanting a first ion species into the photoresist feature, the first ion species having a first ion energy configured to generate a first implantation depth; and
after the implanting the first ion species, implanting a second ion species into the photoresist feature during a second exposure, the second ion species having a second implantation depth less than the first implantation depth,
wherein, after the implanting the first ion species and second ion species, the photoresist feature comprises a shell and inner portion, the shell being denser and more cross-linked than the inner portion.

15. The method of claim 14, wherein the first ion species comprises hydrogen ions, helium ions, carbon ions, boron ions, or nitrogen ions.

16. The method of claim 14, wherein the second ion species comprise argon ions, silicon ions, krypton ions, xenon ions, or germanium ions.

17. A method for processing a substrate, comprising:
providing a patterning feature on the substrate, the patterning feature having a sidewall;
implanting a first on species into the patterning feature during a first exposure, the first on species having a first implantation depth; and
implanting a second on species into the patterning feature during a second exposure, the second on species having a second implantation depth less than the first implantation depth,
wherein the first ion species comprises hydrogen ions, helium ions, carbon ions, boron ions, or nitrogen ions, the patterning feature is a photoresist feature, and after the implanting the first ion species and second ion species, the photoresist feature comprises a shell and inner portion, the shell being denser than the inner portion.

18. The method of claim 17, wherein the second ion species comprise argon ions, silicon ions, krypton ions, xenon ions, or germanium ions.

19. The method of claim 17, wherein the first exposure comprises an ion dose of $1E14/cm^2$ to $2E16/cm^2$ and an ion energy of 1 keV-20 keV, and wherein the second exposure comprises an ion dose of $1E15/cm^2$ to $3E16/cm^2$ and an ion energy of 0.5 keV-3 keV.

20. The method of claim 17, wherein the patterning feature further comprising a patterned anti-reflective coating (ARC) feature.

* * * * *